(12) United States Patent
Tschudin et al.

(10) Patent No.: US 11,774,271 B2
(45) Date of Patent: Oct. 3, 2023

(54) FIELD DEVICE OF AUTOMATION TECHNOLOGY AND METHOD FOR ITS MANUFACTURE

(71) Applicant: Endress+Hauser Flowtec AG, Reinach (CH)

(72) Inventors: Beat Tschudin, Reinach (CH); Christian Gwerder, Grellingen (CH)

(73) Assignee: Endress+Hauser Flowtec AG, Reinach (CH)

( * ) Notice: Subject to any disclaimer, the term of this patent is extended or adjusted under 35 U.S.C. 154(b) by 126 days.

(21) Appl. No.: 17/448,131

(22) Filed: Sep. 20, 2021

(65) Prior Publication Data

US 2022/0003575 A1    Jan. 6, 2022

Related U.S. Application Data

(63) Continuation of application No. 16/064,103, filed as application No. PCT/EP2016/079482 on Dec. 1, 2016, now abandoned.

(30) Foreign Application Priority Data

Dec. 21, 2015    (DE) .................... 10 2015 122 435.6

(51) Int. Cl.
| | |
|---|---|
| *G01D 11/24* | (2006.01) |
| *H01B 3/40* | (2006.01) |
| *G01F 15/00* | (2006.01) |
| *G01F 15/14* | (2006.01) |
| *C08G 59/50* | (2006.01) |
| *C08G 59/56* | (2006.01) |
| *H01L 21/60* | (2006.01) |

(Continued)

(52) U.S. Cl.
CPC .......... *G01D 11/245* (2013.01); *C08G 59/50* (2013.01); *C08G 59/56* (2013.01); *G01F 15/006* (2013.01); *G01F 15/14* (2013.01); *H01B 3/40* (2013.01); *H01L 21/60* (2021.08); *H05K 5/06* (2013.01); *H05K 7/14* (2013.01)

(58) Field of Classification Search
CPC ........ G01D 11/245; H01L 21/60; H01B 3/40; H05K 5/06; H05K 7/14
See application file for complete search history.

(56) References Cited

FOREIGN PATENT DOCUMENTS

EP    1669726 A1 *  6/2006  ........... G01D 11/245

* cited by examiner

*Primary Examiner* — Jamel E Williams
(74) *Attorney, Agent, or Firm* — Mark A. Logan; Endress+Hauser (USA) Holding, Inc.

(57) ABSTRACT

Disclosed is a field device of automation technology comprising a measuring transducer for ascertaining a measurement signal and a measurement transmitter for output of the measurement signal ascertained. The field device has at least one housing of the measuring transducer and/or of the measurement transmitter, in which electronic components of the measuring transducer and/or of the measurement transmitter are arranged, characterized in that the electronic components are embedded in an epoxide polymer foam, which is a reaction product of a self foaming, potting compound comprising at least the following components: 25 to 75 wt-% of a diglycidyl ether resin; at least one amine containing hardening system comprising a Mannich base; and at least one foaming agent, and a method for manufacturing a field device of automation technology.

20 Claims, 1 Drawing Sheet

(51) Int. Cl.
*H05K 5/06* (2006.01)
*H05K 7/14* (2006.01)

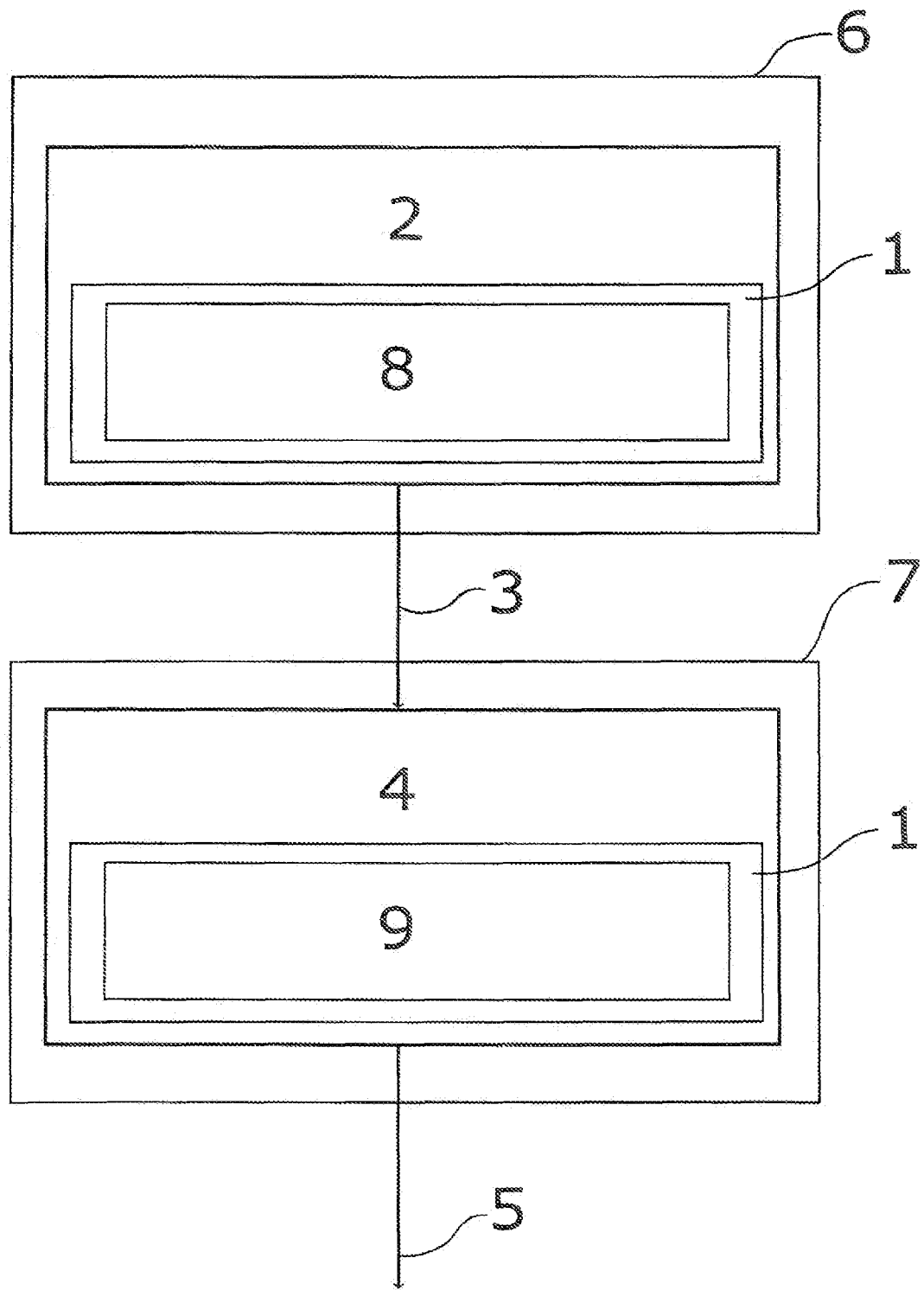

FIELD DEVICE OF AUTOMATION TECHNOLOGY AND METHOD FOR ITS MANUFACTURE

CROSS-REFERENCE TO RELATED APPLICATION

The present continuation application is related to and claims the priority benefit of U.S. Nonprovisional application Ser. No. 16/064,103, filed on Jun. 20, 2018, International Patent Application No. PCT/EP2016/079482, filed on Dec. 1, 2016 and German Patent Application No. 10 2015 122 435.6, filed on Dec. 21, 2015 the entire contents of which are incorporated herein by reference.

TECHNICAL FIELD

The present disclosure relates to a field device of automation technology and to a method for its manufacture.

BACKGROUND

Potting compounds are applied for various reasons in a field device. German Patent, DE 10 2007 058 608 A1 discloses a field device having an embedding mass, which contains spherical, gas-filled, hollow bodies. These serve for Ex-m protection.

Field devices can because of their broad utility be applied in situations where they are subject to especially high temperature fluctuations. This leads to material expansions and contractions within the housing, which can cause defective measurements or in the extreme case can lead to the failure of electronic components.

SUMMARY

Starting from this state of the art, an object of the present disclosure is to provide a field device and a method for its manufacture, which field device is usable in a greater temperature range and has a lower failure rate in the case of temperature change loading.

A field device of the present disclosure of automation technology includes a measuring transducer for ascertaining a measurement signal and a measurement transmitter for output of a measurement signal ascertained, physical variable of a medium in a containment and/or a tube or pipe and/or a measurement signal ascertained property of the material of the medium.

A measuring transducer can, for example, in the case of a magneto-inductive flow measuring device be composed of a magnet system and measuring electrodes arranged on a measuring tube. The measurement signal is a voltage tapped on the measuring electrodes.

The measurement transmitter can, based on this tapped voltage, ascertain a flow, e.g. a flow rate or a total flow over a given period of time, or a flow velocity of the medium through the measuring tube. The selected one of these is then the physical variable. In the case of other field devices, the physical variable can be, for example, the fill level of the medium in the container or the pressure of the medium or the temperature of the medium.

The property of the material of the medium can be e.g. the thermal conductivity, electrical conductivity, viscosity, pH or, in given cases, the concentrations of individual components in the medium.

The field device includes at least one housing of the measuring transducer and/or of the measurement transmitter. I.e. the housing can be for the measuring transducer, the measurement transmitter or both. Thus, there are e.g. compact temperature measuring devices or magneto-inductive flow measuring devices, in the case of which both the measurement transmitter as well as also the measuring transducer are contained in one housing. More frequently, however, measurement transmitter and measuring transducer are spaced from one another. Thus, the separation can be e.g. by way of a neck on the sensor.

Arranged in the aforementioned housings can be electronic components, which are for the measuring transducer and/or the measurement transmitter.

Such electronic components can be, for example, boards and components arranged thereon, planar coils, conventional coils, resistors, especially measuring resistors, cable and the like.

The above-described kinds of field devices, for example, in the field of flow measuring technology, are known per se. Typically, such field devices are calibrated as a function of temperature and applied in practice under quite different temperature conditions.

For reduction of temperature related, material stresses, electronic components are according to the present disclosure embedded in an epoxide polymer foam, which is a reaction product of a self foaming, potting compound, especially a flowable, self foaming, potting compound, comprising at least the following components:

a) 25 to 75 wt-% of a diglycidyl ether resin;
b) at least one amine containing hardening system comprising a Mannich base; and
c) at least one foaming agent.

The self foaming, potting compound can be provided e.g. just shortly before its application against and around the electronic components. Self foaming means that the potting compound itself forms a polymer foam.

An epoxide polymer foam from the aforementioned self foaming, potting compound has an especially optimized compressibility. Additionally, also undercuts in an installation space of the housing become occupied by foam. All together, especially advantageously, the entire free volume of the housing can be filled with foam. It is, in such case, however, preferable not to provide a purely-surficial application of foam onto the individual electronic components. Instead, the foam should extend over the entire breadth of the housing. In this way, an especially advantageous and insulating securement of the electronic components is enabled. Preferably, the polymer foam fills at least 50 vol-% of the housing and especially preferably the entire housing.

Through use of the aforementioned, special, epoxide polymer foam for embedding electronic components, temperature related material stresses are advantageously reduced in the case of temperatures, such as occur in field devices in automation technology. Additionally, the epoxide polymer foam has a high foam stability, so that the electronic components do not shift. Additionally, the force of the foam on the electronic components is small, so that they are not damaged due to temperature related stresses.

Advantageous embodiments of the present disclosure are subject matter of the dependent claims.

Any epoxide polymer foam, which is manufacturable from the aforementioned components, can be applied in the context of the present disclosure.

However, the components of the potting compound are most often not completely consumed during the foaming. Therefore, the components of the potting compound are also detectable in the epoxide polymer foam. Each of the components a)-c) can advantageously be present in the resulting epoxide polymer foam with a residual content of greater than at least 100 ppm, preferably with a residual content of at least 500 ppm.

The diglycidyl ether resin can advantageously be a bisphenol-A- and/or bisphenol-F diglycidyl ether resin.

The foaming agent can advantageously be a polymethyl hydrosiloxane, which preferably is contained in the potting compound up to 5 wt-%. This foaming agent can in combination with an amine and/or an alcohol release CO2. The amine or alcohol can be provided, for example, by the hardener.

Advantageously, the Mannich-base is a reaction product of para-formaldehyde with 4-tert-butylphenol and/or a reaction product of 4,4'-isopropylidenediphenol with 1,3-phenylmethanamine, which preferably is contained at up to 15 wt-% in the potting compound. These two reaction products enable an optimal gel time for allowing foaming to occur. They enable an optimal pore size of preferably 0.1 to 0.5 mm (image analysis) in the foam and/or a defined consistency of the foam at a preferred Shore hardness of D 65-75 (per ISO 868).

The potting compound can additionally advantageously contain as an additional component:

d) a reactive thinner, wherein the reactive thinner comprises preferably at least one aliphatic diglycylether with the general structural formula:

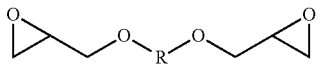

wherein R=butyl- or hexyl-. In this way, the viscosity and the flowability of the foam can be optimally set.

The potting compound can advantageously additionally comprise as an additional component:

e) a flame retarding and/or foam stabilizing filler.

This can be e.g. an aluminum oxide and/or an aluminum hydroxide as a flame retarding component, while use of silicon oxide and/or calcium carbonate rather effects foam stabilizing properties.

The potting compound can additionally advantageously have as an additional component:

f) a dispersion additive for stabilizing the filler in the potting compound.

The potting compound, especially the hardening system, can advantageously contains one or more of the following additional components:

g1) one or more fatty acids, preferably with a chain length of greater than C18, especially preferably unsaturated fatty acids with a chain length of greater than C18, especially in the form of dimers and/or oligomers;

g2) one or more reaction products with tall oil fatty acids and polyamines, preferably with TETA and/or TEPA;

g3) one or more polymers formed from a reaction of 4,4'-isopropylidenediphenol and/or 4,4'-methylene bisphenol with a reaction product of 1-chlorine-2,3-epoxypropane and 3-aminomethyl-3,5,5-trimethylcyclohexane and/or with a reaction product of 1-chlorine-2,3-epoxypropane and trimethylhexane-1,6-diamine;

g4) a trimethylhexane-1,6-diamine, 3-aminomethyl-3,5,5-trimethylcyclohexane and/or 1,3-phenylmethanamine;

g5) an aromatic alcohol, preferably 4,4'-isopropylidenediphenol, benzyl alcohol, salicylic acid, 4-tert-butylphenol and/or phenol; and/or g6) a liquid won from cashew nut shells.

The filler can advantageously have two different granulations with a first grain size of 0.3 to 2.5 μm and a second grain size of 15 to 25 μm (determined by Mastersize 3000 of Malvern), wherein the ratio of the filler with the first grain size to the filler with the second grain size lies between 1 to 3 and 2 to 3. The filler with the larger grain size supplementally stabilizes the foam, while the filler with smaller grain size prevents the filler with the larger grain size from settling out.

A method for manufacturing a field device of automation technology as claimed in one of the preceding claims includes steps as follows:

a) arranging electronic components and, in given cases, further components of the field device within a housing of a measuring transducer and/or measurement transmitter.

The additional components can, in such case, be non-electronic components, e.g. mechanical components:

b) introducing the self foaming, potting compound, especially the flowable, self foaming, potting compound, into the electronics housing to form an epoxide polymer foam; and c) closing, especially medium tightly closing, the housing following a reaction time for foaming and curing, i.e. hardening, the epoxide polymer foam and providing the operation ready field device.

This providing can include, for example, also the loading of software into the field device and a programming.

BRIEF DESCRIPTION OF THE DRAWINGS

FIG. 1 shows a field device according to an embodiment of the present disclosure.

DETAILED DESCRIPTION

The subject matter of the present disclosure will now be explained in greater detail and by means of a concrete example of an embodiment.

In automation technology, especially in process automation technology, field devices are often applied, which serve for registering and/or influencing process variables. Serving for registering process variables are sensors, which, for example, are integrated in fill-level measuring devices, flow measuring devices, pressure- and temperature measuring devices, pH-redox potential measuring devices, conductivity measuring devices, etc., which register the corresponding process variables, fill level, flow, pressure, temperature, pH-value, and conductivity. Serving for influencing process variables are actuators, such as, for example, valves or pumps, via which the flow of a liquid in a pipe or tube section, and the fill level in a container, can be changed. Referred to as field devices are, in principle, all devices, which are applied near to the process and which deliver, or process, process relevant information. In connection with the present disclosure, the terminology, field devices, thus refers also to remote I/Os, radio adapters, and, generally, electronic components, which are arranged at the field level. A large number of such field devices are produced and sold by the firm, Endress+Hauser.

A field device is, in such case, especially selected from a group composed of flow measuring devices, fill-level measuring devices, pressure measuring devices, temperature measuring devices, limit level measuring devices and/or analytical measuring devices.

Flow measuring devices include especially Coriolis-, ultrasonic-, vortex-, thermal- and/or magneto inductive flow measuring devices.

Fill level measuring devices include especially microwave fill level measuring devices, ultrasonic, fill level measuring devices, time domain, reflectometric, fill level measuring devices (TDR), radiometric fill level measuring devices, capacitive fill level measuring devices, inductive fill level measuring devices and/or temperature sensitive fill level measuring devices.

Pressure measuring devices include especially absolute-, relative- and difference pressure measuring devices.

Temperature measuring devices include especially measuring devices with thermocouples and temperature dependent resistances.

Limit level measuring device include especially ultrasonic, limit level measuring devices and/or capacitive, limit level measuring devices.

Analytical measuring devices include especially pH sensors, conductivity sensors, oxygen- and active oxygen sensors, (spectro)-photometric sensors, and/or ion-selective electrodes.

Typically, one distinguishes in the case of the aforementioned field devices between a measuring transducer unit and a measurement transmitter unit. These two units can be spaced from one another and connected together by a so-called sensor neck. This serves, among other things, for thermal decoupling of the measurement transmitter from the measuring point. Known, however, are also field devices, in which the measuring transducer unit and the measurement transmitter unit are united in one housing for compact construction.

Both the measuring transducer unit as well as also the measurement transmitter unit will, in general, contain electronic components. Typical electronic components of the measuring transducer unit can be associated with sensor elements and can be, for example, coils of a magnet system, a measuring resistor for ascertaining the temperature of the medium, ultrasonic transducers of a bimorph drive and/or the like. Electronic components of the measurement transmitter unit can be e.g. measurement amplifier components, data storage area units, CPU, or computer, units and/or the like.

The electronic components are arranged in a measuring transducer- and/or measurement transmitter housing and are embedded in a foam mass in this housing.

In the case of securing electronic components in the housing of a field device by means of an epoxide polymer foam, certain prerequisites must be taken into consideration.

A feature of the epoxide polymer foam is definitely its compressibility. This is required, in order to accommodate temperature change related, material stresses, in order to protect the sensitive electronic components. Such material stresses could lead, among other things, to defective measurements and in the extreme case to a failure of the electronic component.

Field devices are, in such case, exposed to a temperature change due to the most often absolutely necessary calibration. A field device of process automation can additionally be applied in all kinds of different environmental conditions. Thus, the field device can, for example, be utilized both for flow measurement of cryogenic liquids as well as also heated oil mixtures or vapors.

Ideally, the epoxide polymer foam should also provide a thermal insulation of the electronic components from the housing wall of the housing of the field device surrounding the electronic components.

The starting composition for manufacture of the epoxide polymer foam will now be explained in greater detail. The epoxide polymer foam is formed from a self foaming, potting compound.

The self foaming, potting compound is based on a diglycidyl ether resin, preferably a bisphenol-A- and/or bisphenol-F diglycidyl ether resin. This base resin is preferably contained in the educt mixture at a level between 25 to 75 wt-%. It can, thus, preferably be a one component base resin, which is made to react.

The preferred average molecular weight of the diglycidyl ether resin amounts to greater than 500 g/mol, preferably greater than 700 g/mol.

The preferred viscosity of the diglycidyl ether resin, per DIN 53019, amounts to 8 to 13 Pa*s at 25° C.

The self foaming, potting compound additionally includes a foaming agent. The foaming agent is preferably polymethyl hydrosiloxane. The foaming agent, especially polymethyl hydrosiloxane, can preferably be contained at up to 5 wt-% in the potting compound. In a preferred embodiment of the present disclosure, polymethyl hydrosiloxane is contained in the potting compound at between 0.3 and 2 wt-%.

Polymethyl hydrosiloxane is, normally, utilized as a water repelling agent. In the present case, however, a side reaction of this agent is utilized. It reacts with an amine and/or with an alcohol to give off $CO_2$. The amine can be, for example, an amine contained in the potting compound. Advantageously, polymethyl hydrosiloxane provides an optimal $CO_2$ release velocity.

A further component of the potting compound is a hardening system comprising at least one amine and/or an alcohol. This hardening system comprises additionally a Mannich base. The amine and/or the alcohol can preferably be introduced in a preliminary reaction with the diglycidyl ether resin and additional optional ingredients. Then, the Mannich base is added, so that gel formation occurs. It has surprisingly been found that, by adding the Mannich base, the hardening time can be optimally set in such a manner that gel formation begins during the development of the foaming agent and the epoxide mass hardens shortly after the foaming.

Thus, the complete curing of the potting compound to the epoxide polymer foam can occur in a preferred time span of, for instance, 0.4 to 2 hours, especially within 0.5-1 hour. On the whole, use of the Mannich-base in the amine- and/or alcohol containing hardening system gives the potting compound sufficient time for foaming.

The potting compound, in such case, does not collapse, nor does it grow too rapidly and it has the right viscosity, such that undercuts within an electronics housing are filled with the polymer foam, such being not the case for many foam systems, such as structural foam.

Through use of the aforementioned hardening system, thus, a controlled and unhurried rising of the polymer foam from the potting compound can occur, without the system collapsing. The self foaming, potting compound can be introduced at room temperature.

As components of the hardening system, the self foaming, potting compound includes preferably at least one or more of the hereinafter-described components.

One or more fatty acids can be applied in the hardening system. Preferred fatty acids have a chain length of greater than C18. The fatty acids are preferably unsaturated fatty acids. Preferably, the fatty acids are dimers and/or oligomers. Alternatively or supplementally to the fatty acids, the hardening system can also contain one or more reaction products with tall oil fatty acids and polyamines, especially TETA and/or TEPA. The concentration of the one or more fatty acids or of the aforementioned reaction product and/or the reaction products in the potting compound is preferably up to 15 wt. %.

Alternatively or supplementally, the hardening system in the self foaming, potting compound can contain a polymer, which is formed from 4,4'-isopropylidenediphenol and/or 4,4'-methylene bisphenol reacted with 1-chlorine-2,3-epoxypropane reacted with 3-aminomethyl-3,5,5-trimethylcyclohexane and/or trimethylhexane-1,6-diamine. This polymer can be present in the potting compound at up to 15 wt-%.

Another alternative or additional component of the hardening system can be trimethylhexane-1,6-diamine and/or 3-aminomethyl-3,5,5-trimethylcyclohexane and/or 1,3-phenylmethanamine at up to 15 wt-%.

An alternative or optional component of the hardening system can be a reaction product of para-formaldehyde with 4-tert-butylphenol and/or a reaction product of 4,4'-isopropylidenediphenol with 1,3-phenylmethanamine. This component can likewise be present at up to 15 wt-% in the potting compound.

Furthermore, an alternative or optional component of the hardening system can be at least one aromatic alcohol at up to 15 wt-%. This aromatic alcohol can preferably be selected from the following group: 4,4'-isopropylidenediphenol, benzyl alcohol, salicylic acid, 4-tert.-butylphenol and/or phenol.

Furthermore, alternatively or optionally, the potting compound can have up to 10 wt-% of a liquid won from cashew nut shells.

Besides the base resin, the hardening system and the foaming agent, the self foaming, potting compound can have yet other components, which supplementally improve the properties of the epoxide polymer foam.

Thus, the potting compound can optionally have one or more reactive thinners. This reactive thinner lessens the viscosity of the potting compound, in order to enable a better flow of the potting compound in the housing and a better embedding and wetting of the electronic components and the housing wall. A reactive thinner is, in such case, not to be confused with a thinning means, since the reactive thinner requires most often significantly lower amounts, in order to reduce the viscosity of the potting compound to a desired target viscosity. As reactive thinner for the self foaming, potting compound in the context of the present disclosure, preferably an aliphatic diglycylether or a plurality of aliphatic diglycylethers with the general structural formula:

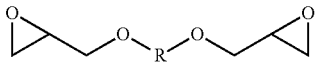

can be applied, wherein R=butyl or hexyl.

The self foaming, potting compound can optionally contain fillers. The fillers serve primarily for providing a flame retarding effect and/or an additional stabilizing of the foam and can preferably be contained in the potting compound at up to 70 wt-%, especially preferably from 50 to 70 wt-%. These fillers comprise one or more of the following compounds: silicon dioxide, calcium carbonate, aluminum hydroxide and/or aluminum oxide.

In a preferred embodiment, the potting compound contains filler in at least two different grain sizes. A first grain size has according to measurement by laser diffraction a D10 of 0.5 µm, a D50 of 1 µm and a D90 of 2.4 µm. Fillers with this first grain size are contained in a preferred embodiment at at least up to 10 wt-% in the potting compound.

A second grain size has according to measurement by laser diffraction a D10 of 3 µm, a D50 of 20 µm and a D90 of 50 µm. Fill substances with this second grain size are contained in a preferred embodiment at at least up to 30 wt-% in the potting compound.

The ratio of filler with the first grain size to filler with the second grain size is from 1 to 3 to 2 to 3 in the potting compound.

The application of fillers with at least two grain sizes supplementally increases the stability of the polymer foam and lessens sedimentation of the filler with the greater grain size.

Furthermore, optionally present in the self foaming, potting compound can be a dispersion additive, which controls flocculation of fillers in the potting compound. Such dispersion additives avoid especially the settling and loss of fillers from the potting compound. Preferred dispersion additives include one or more polycarboxylic acid polymers. In such case, preferably the concentration of dispersion additive is 5 wt-% or less.

In the following, a concrete example of an embodiment will be given, which in the context of the present disclosure is introduced as self foaming, potting compound into a housing of a measuring transducer and/or measurement transmitter and hardens to an epoxide polymer foam while embedding electronics components located in the housing.

Thus, the following is an example of a particular potting compound:

| Potting Compound 1 (130 parts total) | |
| --- | --- |
| Epikote Resin 169 | 40 |
| Heloxy Modifier BD | 5 |
| BYK-P 105 | 2 |
| Bluesil WR 68 | 1 |
| Apyral 2E | 60 |
| Aradur HY 842 | 10 |
| D.E.H. 615 | 5 |
| adduct of Epikote Resin 169 (40 parts by weight) with Vestamin TMD (100 parts by weight) | 7 |

In such case, Epikote Resin 169 is a diglycidylether base resin;

Heloxy Modifier BD an aliphatic diglycidylether as a reactive thinner,

BYK-P 105 a polycarboxylic acid polymer as dispersion additive, Bluesil WR 68 a polymethyl hydrosiloxane as foaming agent, Apyral 2E a flame retarding filler in the form of aluminum hydroxide, Aradur HY 842 a polyamidoamine hardening means as part of a hardening system, D.E.H. 615 a Mannich base as part of the hardening system, and a reaction product of Epikote Resin 169 (40 weight %) with Vestamin TMD (100 weight %) as part of the hardening system.

The latter is reacted before addition to the potting compound, wherein a part of the added excess—of Vestamin TMD reacts with the base resin. A large part of Vestamin does not react with the base resin and is present in the epoxide polymer foam in detectable amounts after the reaction forming the epoxide polymer foam, just as in the case of the Mannich base.

The self foaming, potting compound is prepared only very shortly, preferably less than 5 minutes, for example, 3 minutes, before pouring onto the electronic components. The self foaming, potting compound is prepared by mixing the foaming agent and/or the individual hardener components into the diglycidyl ether resin. Gel formation occurs concurrently with foaming and a housing filled out with epoxide polymer foam can result in a time span of, for example, 40 minutes. In the case of application of polymethyl hydrosiloxane as foaming agent, the foam formation can advantageously occur at normal environmental temperatures between 20 and 40° C.

In a preferred embodiment, the potting compound contains bisphenol, but is, however, free of additional phenols and/or phenol derivatives.

What is claimed is:

1. A field device of automation technology, comprising:
a measuring transducer for ascertaining a measurement signal of a physical variable of a medium in a containment, tube, or pipe;
a measurement transmitter for output of the measurement signal;
a first housing embodied to house the measuring transducer, including electronic components of the measuring transducer;
a second housing embodied to house the measurement transmitter, including electronic components of the measurement transmitter; and
an epoxide polymer foam that is a reaction product of a self-foaming potting compound, the potting compound comprising:
a) 25% to 75% by weight of a diglycidyl ether resin;
b) an amine-containing hardening system comprising a Mannich base; and
c) a foaming agent,
wherein the electronic components of the measuring transducer are embedded in the epoxide polymer foam within the respective housing.

2. The field device as claimed in claim 1, wherein:
each of the components a) through c) is contained in the epoxide polymer foam with a residual content of at least 100 ppm.

3. The field device as claimed in claim 1, wherein:
the diglycidyl ether resin is a bisphenol-A- and/or bisphenol-F diglycidyl ether resin.

4. The field device as claimed in claim 1, wherein:
the foaming agent is a polymethyl hydrosiloxane.

5. The field device as claimed in claim 1, wherein:
the Mannich base is a reaction product of para-formaldehyde with 4-tertbutylphenol and/or a reaction product of 4,4'-isopropylidenediphenol with 1,3-phenylmethanamine.

6. The field device as claimed in claim 1, wherein the potting compound further comprises a reactive thinner, wherein the reactive thinner includes an aliphatic diglycylether with the general structural formula:

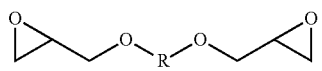

wherein R=butyl- or hexyl-.

7. The field device as claimed in claim 1, wherein the potting compound further comprises a flame retarding and/or foam stabilizing filler.

8. The field device as claimed in claim 7, wherein the potting compound further comprises a dispersion additive for stabilizing the filler in the potting compound.

9. The field device as claimed in claim 1, wherein the potting compound further comprises:
one or more fatty acids; and/or
one or more reaction products with tall oil fatty acids and polyamines; and/or
one or more polymers formed from a reaction of 4,4'-isopropylidenediphenol and/or 4,4'-methylene bisphenol with a reaction product of 1-chlorine-2,3-epoxypropane and 3-aminomethyl-3,5,5-trimethylcyclohexane and/or with a reaction product of 1-chlorine-2,3-epoxypropane and trimethylhexane-1,6-diamine; and/or
a trimethylhexane-1,6-diamine; 3-aminomethyl-3,5,5-trimethylcyclohexane and/or 1,3-phenylmethanamine; and/or
an aromatic alcohol; and/or
a liquid won from cashew nut shells.

10. The field device as claimed in claim 7, wherein the filler has two different granulations with a first grain size of 0.3 to 2.5 μm and a second grain size of 15 to 25 μm, wherein the ratio of filler with the first grain size to filler with the second grain size lies between 1 to 3 and 2 to 3.

11. The field device as claimed in claim 2, wherein:
each of the components a) through c) is contained in the epoxide polymer foam with a residual content of at least 500 ppm.

12. The field device as claimed in claim 4, wherein:
the foaming agent is contained in the potting compound at up to 15% by weight.

13. The field device as claimed in claim 5, wherein:
the Mannich base is contained in the potting compound at up to 15% by weight.

14. The field device as claimed in claim 7, wherein:
the flame retarding and/or foam stabilizing filler is an aluminum oxide, an aluminum hydroxide, a silicon oxide, and/or a calcium carbonate.

15. The field device as claimed in claim 9, wherein:
the one or more fatty acids have a chain length of greater than C18.

16. The field device as claimed in claim 15, wherein:
the one or more fatty acids are unsaturated fatty acids.

17. The field device as claimed in claim 9, wherein:
the one or more fatty acids are unsaturated fatty acids with a chain length of greater than C18.

18. The field device as claimed in claim 9, wherein:
the aromatic alcohol is 4,4'-isopropylidenediphenol, benzyl alcohol, salicylic acid, 4-tert.-butylphenol, and/or phenol.

19. A method for manufacturing a field device of automation technology, the method comprising:
providing a measuring transducer for ascertaining a measurement signal of a physical variable of a medium in a containment, tube, or pipe;
providing a measurement transmitter for output of the measurement signal;
providing a first housing embodied to house the measuring transducer, including electronic components of the measuring transducer;
providing a second housing embodied to house the measurement transmitter, including electronic components of the measurement transmitter;
providing a self-foaming potting compound, the potting compound comprising:
a) 25% to 75% by weight of a diglycidyl ether resin;

b) an amine-containing hardening system comprising a Mannich base; and
c) a foaming agent;

arranging the electronic components of the measuring transducer in the first housing;

arranging the electronic components of the measurement transmitter in the second housing;

introducing the self-foaming potting compound into the first housing and into the second housing to form in each housing an epoxide polymer foam, wherein the electronic components of the measuring transducer and the electronic components of the measurement transmitter are embedded in the epoxide polymer foam within the respective housing;

closing each housing following a reaction time for foaming; and curing and hardening the epoxide polymer foam.

20. A field device of automation technology, comprising:

a measuring transducer for ascertaining a measurement signal of a physical variable of a medium in a containment, tube, or pipe;

a measurement transmitter for output of the measurement signal;

a first housing embodied to house the measuring transducer, including electronic components of the measuring transducer;

a second housing embodied to house the measurement transmitter, including electronic components of the measurement transmitter; and an epoxide polymer foam that is a reaction product of a self-foaming potting compound, the potting compound comprising:

a) 25% to 75% by weight of a diglycidyl ether resin;
b) an amine-containing hardening system comprising a Mannich base; and
c) a foaming agent, wherein the electronic components of the measurement transmitter are embedded in the epoxide polymer foam within the respective housing.

* * * * *